United States Patent

[11] 3,603,894

[72] Inventors Gildo Cecchin
Niles;
Francis H. Hilbert, River Grove, both of, Ill.
[21] Appl. No. 848,635
[22] Filed Aug. 8, 1969
[45] Patented Sept. 7, 1971
[73] Assignee Motorola, Inc.
Franklin Park, Ill.

[54] STACKED DIFFERENTIAL AMPLIFIERS
5 Claims, 2 Drawing Figs.

[52] U.S. Cl. .......... 330/30, 330/69
[51] Int. Cl. .......... H03f 3/68
[50] Field of Search .......... 307/241; 330/22, 30, 30 D, 40, 69

[56] References Cited
UNITED STATES PATENTS

| | | | |
|---|---|---|---|
| 3,474,440 | 10/1969 | Schmid .......... | 307/241 X |
| 3,497,824 | 2/1970 | Goordman .......... | 330/30 X |

*Primary Examiner*—Roy Lake
*Assistant Examiner*—Lawrence J. Dahl
*Attorney*—Mueller & Aichele ABSTRACT: A cascaded train of transistor differential amplifier circuits are operated with a single primary constant current source connected to the first amplifier of the train. The constant current sources for each of the other differential amplifiers are obtained by recombining the signals present on the collectors of the transistors in the next preceding amplifier in common to the emitters of each of the transistors in the subsequent differential amplifier stage.

Inventors
GILDO CECCHIN
FRANCIS H. HILBERT
BY Mueller, Aichele & Rauner
ATTYS.

STACKED DIFFERENTIAL AMPLIFIERS

BACKGROUND OF THE INVENTION

In the operation of a conventional transistor differential amplifier, a constant current source is generally utilized at the coupled emitters of the transistors of the amplifier, since the provision of a high impedance at this point provides for better differential amplifier action and greater commonmode rejection. The inputs to the amplifier then may be fully differential, single-ended, or a combination of inputs.

Generally when two stages of a cascaded differential amplifier are employed, a separate constant current source is used for each of the stages; and each of the differential amplifiers is supplied with the full potential of the source. As a consequence, if one of the differential amplifiers is to be operated off of a lower voltage, additional components must be utilized in order to establish this lower operating voltage for the amplifier.

In some applications it is desirable to eliminate the necessity of a separate constant current source for a plurality of cascaded differential amplifiers; and in addition, to eliminate the necessity for operating each of cascaded differential amplifiers across the full potential of the source.

SUMMARY OF THE INVENTION

Accordingly, it is an object of this invention to provide an improved cascaded differential amplifier circuit.

It is an additional object of this invention to operate a plurality of cascaded differential amplifiers utilizing a single constant current source.

It is a further object of this invention to operate a plurality of cascaded differential amplifiers as independent function amplifiers.

It is another object of this invention to recombine the currents present on the collectors of each of the transistors of a plurality of cascaded transistor differential amplifiers to serve as a constant current source for the coupled emitters of the next subsequent differential amplifier in the cascaded sequence of amplifiers.

In accordance with a preferred embodiment of this invention, at least two transistorized differential amplifiers are operated with a single constant current source for the amplifier elements of one of the differential amplifiers. The output currents of that one differential amplifier then are combined as a constant current source for the other of the differential amplifiers. This technique may be utilized in order to cascade any desired number of differential amplifiers across a source of operating potential using a single constant current source for the entire cascaded sequence of the differential amplifiers.

DETAILED DESCRIPTION

Figure 1:
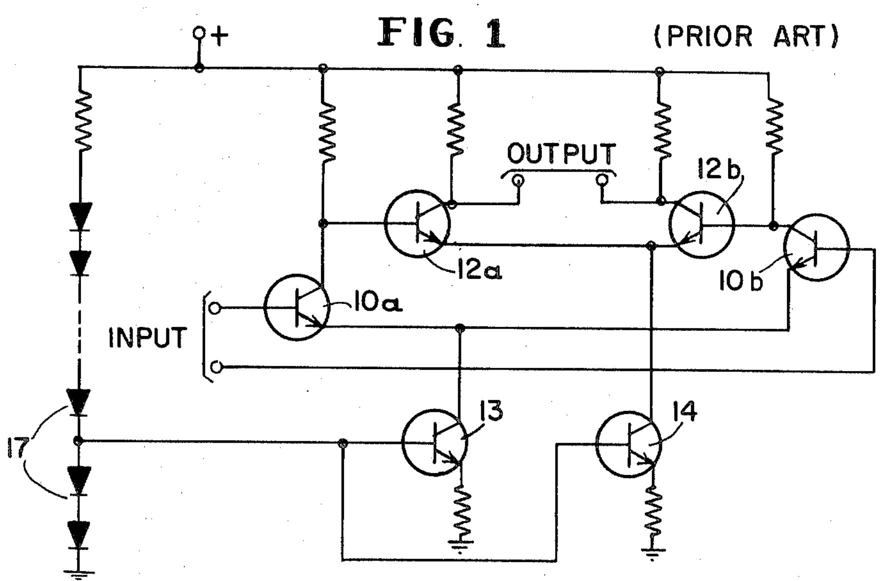
FIG. 1 (PRIOR ART)
FIG. 1 is a schematic diagram of a prior art type of cascaded differential amplifier circuit.

Referring now to FIG. 1, there is shown a typical prior art type of cascaded differential amplifier circuit in which a first differential amplifier, consisting of a pair of transistors 10*a* and 10*b*, is used to supply input signals to a second differential amplifier circuit, including a corresponding pair of transistors 12*a* and 12*b*, with the collectors of the transistors 10*a* and 10*b* being connected respectively to the bases of the transistors 12*a* and 12*b*. A source of positive battery voltage is connected through appropriate collector resistors to the collectors of each of the transistors, and a constant current source for each of the differential amplifiers 10*a*, 10*b* and 12*a*, 12*b* is established by means of an NPN transistor 13 for the differential amplifier 10*a*, 10*b* and an NPN transistor 14 for the differential amplifier 12*a*, 12*b*.

A source of constant DC biasing potential for the transistors 13 and 14 is obtained from a voltage divider including a string of series-connected forward-biased diodes 17. The manner in which these diodes provide a constant voltage is well known, so that the transistors 13 and 14 operate as constant current sources for the respective differential amplifiers connected to them.

The output for the circuit shown in FIG. 1 is obtained from the collectors of the transistors 12*a* and 12*b*, and it should be noted that the full potential of the positive source of operating potential is placed across both of the differential amplifier circuits and their respective constant current transistors. In addition, a separate constant current source is required for each of the different differential amplifiers 10*a*, 10*b* and 12*a*, 12*b*, of the circuit shown in FIG. 1.

Figure 2:
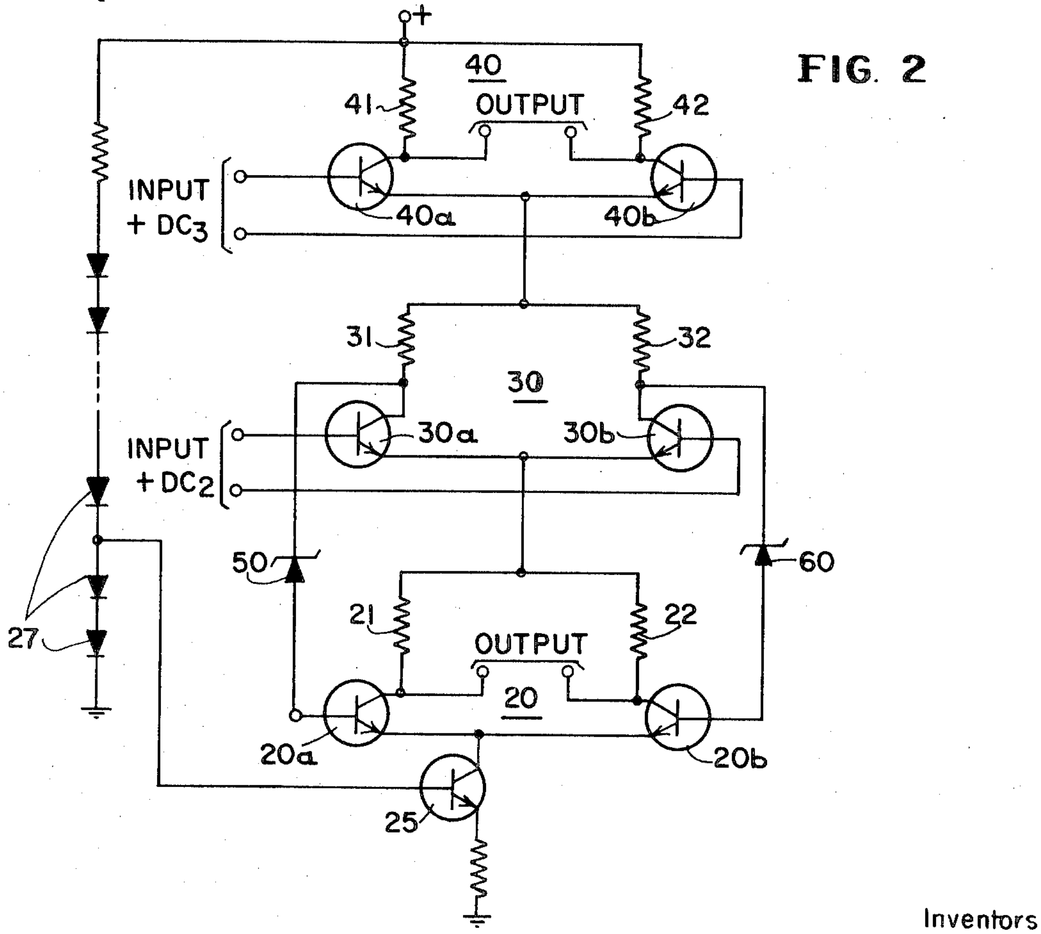
FIG. 2 is a schematic diagram of cascaded differential amplifiers interconnected in accordance with a preferred embodiment of this invention.

Referring now to FIG. 2, there is shown a cascaded differential amplifier circuit in accordance with a preferred embodiment of this invention, utilizing a single constant current source for all of the cascaded differential amplifiers and also operating in a manner to provide independence of function if so desired. The circuit shown in FIG. 2 is especially suitable for integrated circuit applications and is particularly useful in an integrated circuit having a relatively high DC power supply.

In the embodiment shown in FIG. 2, three differential amplifiers 20, 30 and 40 are provided in the cascaded train or sequence, with each of the amplifiers including a first transistor 20*a*, 30*a* and 40*a*, respectively. The operation of these transistors in each differential amplifier circuit is comparable to the operation of the transistors 10*a*, 10*b* and 12*a*, 12*b* of the differential amplifiers shown in FIG. 1. In contrast to the circuit shown in FIG. 1, however, only a single active constant current source in the form of an NPN transistor 25 is provided, with the base bias for the transistor 25 being obtained from a forward-biased diode string 27.

The constant current source transistor 25 has its collector connected to the interconnected emitters of the transistors 20*a* and 20*b* to provide the current source for the differential amplifier 20. In order that a current source may be provided for the differential amplifier 30, the current drawn by the transistors 20*a* and 20*b* of the differential amplifier 20 is recombined by interconnecting the collectors of the transistors 20*a* and 20*b* through resistors 21 and 22, respectively, to a common junction, which in turn is connected to the interconnected emitters of the transistors 30*a* and 30*b*. Thus, irrespective of which of the transistors 20*a* or 20*b* is conducting or which of the transistors is drawing more current, the total current drawn by the transistors 20*a* and 20*b* is constant as determined by the current source 25. Therefore, by recombining the current drawn through the transistors 20*a* and 20*b* in the manner described, a constant current source also is provided for the differential amplifier 30.

In a similar manner, the collectors of the transistors 30*a* and 30*b* of the differential amplifier 30 are interconnected through collector resistors 31 and 32, respectively, to a common junction, which in turn is connected to the interconnected emitters of the transistors 40*a* and 40*b*. Thus, a constant current source through the differential amplifier 30 is provided for the two transistors 40*a* and 40*b* of the differential amplifier 40. The differential amplifier 40 constitutes the last amplifier in the train, and the collectors of the transistors 40*a* and 40*b* are connected respectively through resistors 41 and 42 to the source of positive operating potential.

In FIG. 2 external inputs are shown as applied to the differential amplifiers 30 and 40, and these inputs may be single ended, fully differential, or in combination at the option of the user of the circuit. In addition to the signal inputs applied to the bases of the transistors in the differential amplifiers 30 and 40, it also is necessary to provide a DC operating bias to the bases of these transistors. This DC bias has been indicated in FIG. 2 by $DC_3$ and $DC_2$ for the differential amplifiers 40 and 30, respectively. The only requirement of this DC bias voltage is that $DC_3$ is greater than $DC_2$, which in turn is greater than the operating bias supplied to the bases of the transistors 20*a* and 20*b* of the first differential amplifier in the train.

It is important to note that the differential amplifiers may be operated as independent function amplifiers, each capable of processing signals and the differential amplifier 40 has been so illustrated with the input being applied to the bases of the transistors 40*a* and 40*b* and with the output being obtained from the collectors of these same transistors. In addition, it is possible to utilize the amplifiers in cascade, with the input being applied as shown to the bases of the transistors 30*a* and 30*b* and with the outputs of these transistors being applied through a pair of Zener diodes 50 and 60, respectively, to the bases of the transistors 20*a* and 20*b* to serve at the inputs for the differential amplifier 20. The Zener diodes 50 and 60 provide the necessary DC voltage drop required to cause the DC biasing voltage applied to the bases of the transistors 20*a* and 20*b* to be less than the DC biasing voltage applied to the bases of the transistors 30*a* and 30*b*. The output signal from the cascaded amplifier stages 30 and 20 then may be obtained from the collectors of the transistors 20*a* and 20*b* as indicated on the drawing.

Because of the capability of independence of function of all of the amplifiers in the cascaded sequence shown in FIG. 2, it is possible to utilize entirely different types of signals for the inputs to each of the amplifiers. For example, the input to the amplifier 40 could be an audio signal and the input to the amplifier 30 could be an IF signal cascaded with the amplifier 20 with the output being obtained from the amplifier 20. In the alternative, the output of the amplifier 30 could be independent of the input to the amplifier 20, with a third input such as the video signal for a television receiver being applied to the bases of the transistors 20*a* and 20*b* of the differential amplifier 20. The amplifiers work as well for DC input signals as AC signals, and DC signals can be applied to some of the amplifiers simultaneously with the application of AC signals to other ones of the amplifiers. There is no necessity for large (with respect to signal) capacitors across each junction amplifier which is the usual case for series-stacking, because the nature of the differential amplifiers obviates such a requirement.

In addition it should be noted that the number of stages which may be cascaded by the use of the technique described above in conjunction with FIG. 2 is theoretically infinite, dependent only, of course, upon the size of the power supply available to drive the differential amplifiers, since each amplifier causes a drop of a finite predetermined voltage (approximately 2 volts) thereacross for its operation. Thus, as integrated circuit techniques permit the use of higher power supplies, integrated amplifier circuits cascaded in the manner shown in FIG. 2 will become increasingly desirable, since no longer is it necessary to place the entire voltage supply across each differential amplifier of a cascaded differential amplifier configuration. Any output of the amplifiers can be used as the input for another of the amplifiers with proper DC level shifting or AC coupling, or each of the amplifiers may be operated as an independent function amplifier.

We claim:

1. An amplifier circuit including in combination:

at least two differential amplifiers each including a pair of amplifier elements, each amplifier element having input, output and third electrodes;

a first active current source connected in common with the third electrodes of the amplifier elements of one of the differential amplifiers;

first load resistance means connected between the output electrode of one of the amplifier elements of said one differential amplifier and the third electrodes of the amplifier elements of the other differential amplifier;

first circuit means coupling the output electrode of the other amplifier element of said one differential amplifier with the third electrodes of the amplifier elements of the other differential amplifier, the first circuit means and the first load resistance means together acting as a second current source for said other differential amplifier;

first signal input means for applying first input signals to the input electrodes of the amplifier elements of said one differential amplifier to vary the relative conductivity of the amplifier elements to which the first input signals are applied;

second signal input means for applying second input signals to the amplifier elements of said other differential amplifier to vary the relative conductivity of the amplifier elements to which the second input signals are applied;

first and second DC supply terminals;

second load resistance means connecting the first supply terminal with the output electrode of one of the amplifier elements of said other differential amplifier;

second circuit means connecting the first DC supply terminal with the output electrode of the other amplifier element of said other differential amplifier; and means connecting the first current source with the second DC supply terminal.

2. The combination according to claim 1 wherein the amplifier elements of the differential amplifiers are transistors, each having base, collector, and emitter electrodes corresponding respectively to the input, output, and third electrodes, and wherein the collector electrodes of each of the transistors in said one differential amplifier are connected through respective load resistors to the emitter electrodes of the transistors of said other differential amplifier, and the collector electrodes of each of the transistors in said other differential amplifier are connected through respective load resistors to the first supply terminal.

3. An amplifier circuit including in combination:

a cascade of $n$ differential amplifier circuits where $n$ is a positive integer greater than 1, each of said differential amplifier circuits including first and second transistors, each of which has base, collector, and emitter electrodes;

first and second load resistors connected to the collectors of the first and second transistors in each of said differential amplifier circuits;

a constant current source connected in common to the emitter electrodes of a first one of the differential amplifiers;

means connecting the first and second load resistors of the first one of the differential amplifiers and of each of the subsequent differential amplifiers except the $n$th in common to the emitters of the transistors in the next differential amplifier in the cascade to act as a constant current source for said next differential amplifier;

first and second DC supply terminals;

means connecting the first and second load resistors of the $n$th differential amplifier in the cascade to the DC supply terminal;

means coupling the constant current source with the second (FL 27) DC supply terminal;

means for applying DC biasing potentials to the bases of the transistors in each of the differential amplifiers;

means for applying input signals to the bases of the transistors in each of the differential amplifiers to vary the relative conductivity of the transistors in each of said differential amplifiers in accordance with variations in the input signals applied to the bases thereof; and means for obtaining independent outputs from the collectors of the transistors in each of the differential amplifiers.

4. The combination according to claim 1 wherein the first current source is a constant current source.

5. The combination according to claim 1 further including means for supplying a DC biasing potential to the bases of the transistors in said other differential amplifier, and means interconnecting each of the collectors of the transistors of said other differential amplifier with the corresponding bases of the transistors of said one differential amplifier for establishing a DC operating bias and a signal input for the transistors of said one differential amplifier.